(12) United States Patent
Griffiths (10) Patent No.: US 7,741,194 B2
(45) Date of Patent: Jun. 22, 2010

(54) REMOVABLE LAYER MANUFACTURING METHOD

(75) Inventor: James R. Griffiths, Chandler, AZ (US)

(73) Assignee: Freescale Semiconductor, Inc., Auustin, TX (US)

(*) Notice: Subject to any disclaimer, the term of this patent is extended or adjusted under 35 U.S.C. 154(b) by 226 days.

(21) Appl. No.: 11/969,604

(22) Filed: Jan. 4, 2008

(65) Prior Publication Data
US 2009/0176348 A1 Jul. 9, 2009

(51) Int. Cl.
*H01L 21/46* (2006.01)
(52) U.S. Cl. .............................. 438/458; 257/E21.122; 257/E21.499
(58) Field of Classification Search .................. 438/108, 438/127, 128, 458; 257/E21.122, E21.499
See application file for complete search history.

(56) References Cited
U.S. PATENT DOCUMENTS

| | | | |
|---|---|---|---|
| 4,246,595 A * | 1/1981 | Noyori et al. ................ | 257/668 |
| 6,838,776 B2 | 1/2005 | Leal et al. | |
| 6,921,975 B2 | 7/2005 | Leal et al. | |
| 7,045,391 B2 * | 5/2006 | Lin ............................. | 438/109 |
| 2007/0284704 A1 | 12/2007 | Leal et al. | |

* cited by examiner

*Primary Examiner*—W. David Coleman
(74) *Attorney, Agent, or Firm*—Ingrassia, Fisher & Lorenz, P.C.

(57) ABSTRACT

A method (200) is described for an electronic assembly (30). An electronic die (24) with a sacrificial layer (28) on its back (27) and electrical contacts (26) on its front (25) is temporarily attached by its front (25) to a substrate (32). The back (27) is over-molded by a first material (34) extending over the substrate (32). The substrate (32) is removed leaving the die contacts (26) and the first material (33, 34) exposed. Interconnect layer(s) (44, 64) are provided over the first material (33, 34) and the die (24), electrically coupled to the contacts (26). Further components (66) can be coupled to the upper-most interconnects (64, 53). A second material (68) is over-molded over the components (66) and upper-most interconnects (64, 53). Thinning the first material (34) exposes the sacrificial layer (28) for removal. The die back (27) and vias (70) in the first material (34) extending to the first interconnect layer (43-2) laterally outside the die (24) are filled with a conductor (72, 72', 73), providing single surface electrical and thermal contact (73-1, 73-2), separated by just the die thickness from heat generating regions of the die (24).

20 Claims, 7 Drawing Sheets

FIG. 17

REMOVABLE LAYER MANUFACTURING METHOD

TECHNICAL FIELD

The present invention generally relates to integrated electronic assemblies and, more particularly, relates to a method for forming an electronic assembly incorporating multiple semiconductor die and other electronic components.

BACKGROUND

Modular electronic assemblies containing interconnected semiconductor (SC) die and other components are much used. In many applications, especially those involving radio frequency (RF) operation, it is important that the very good ground connections and very good thermal connections be made to various electronic elements within the assembly. This is especially true for RF integrated circuits (ICs) and RF power amplifiers where efficient heat removal and low RF ground inductance are vital to achieving the desired performance. The challenge of achieving efficient heat removal and low ground inductance is especially difficult in electronic assemblies that are used in many consumer and industrial applications where the electronic assembly must be as compact as possible. For example, in consumer electronic products such as cellular telephones and personal digital assistants (PDAs), the electronic assemblies providing the desired functionality must be as thin as possible in so that the outer dimensions of the device, especially the thickness may be made as small as possible Accordingly, there is an ongoing need for manufacturing methods capable of efficiently providing very thin electronic assemblies with improved thermal properties and low connection impedance for attachment to a the circuit motherboard or tape of the finished device. Other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawing figures, wherein like numerals denote like elements.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

For simplicity and clarity of illustration, the drawing figures illustrate the general manner of construction and method of fabrication, and descriptions and details of well-known features and techniques may be omitted to avoid unnecessarily obscuring the invention. Additionally, elements in the drawings figures are not necessarily drawn to scale. For example, the dimensions of some of the elements or regions in some of the figures may be exaggerated relative to other elements or regions of the same or other figures to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of use in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. It is to be understood that the embodiments of the invention described herein may be used, for example, in other orientations than those illustrated or otherwise described herein. The term "coupled," as used herein, is defined as directly or indirectly connected in an electrical or non-electrical manner.

It is desirable to provide an improved method of manufacture of electronic assemblies that permits use of multiple interconnect layers and multiple electronic components when needed, and at the same time, provides an arrangement for coupling the primary heat sources within the assembly directly to the circuit motherboard to which the assembly is intended to attach without use of intermediate heat sinks. It is further desirable that the manufacturing methods and materials employed be compatible with present day manufacturing capabilities and materials, and not require substantial modifications of available manufacturing procedures or significant increase in occupied area or other increase in manufacturing costs. It is still further desirable that the overall thickness of the assembly be able to be minimized.

FIGS. 1 through 13 are simplified schematic cross-sectional views through electronic assembly 30 (see FIG. 13) at different stages 20-1 through 20-13 of manufacture, according to an embodiment of the present invention. Referring now to manufacturing stage 20-1 of FIG. 1, substrate wafer 22 (e.g., a semiconductor wafer or semiconductor-on-insulator (SOI) wafer or equivalent) of thickness 23 is provided. Thickness 23 for wafers (and individual die 24) is usefully in the range of about 50 to 200 micrometers and typically in the range of about 100 micrometers, but thinner and thicker wafers and die can also be used. In the case of assemblies destined for use in very thin electronic apparatus, it is desirable to use die that are toward the smaller end of the thickness range, but thin wafers are more fragile and harder to handle in manufacturing. Thus, it is desirable to use a manufacturing process for forming assemblies that minimizes handling once the wafers have been thinned to the desired thickness dimension.

Figure 1:
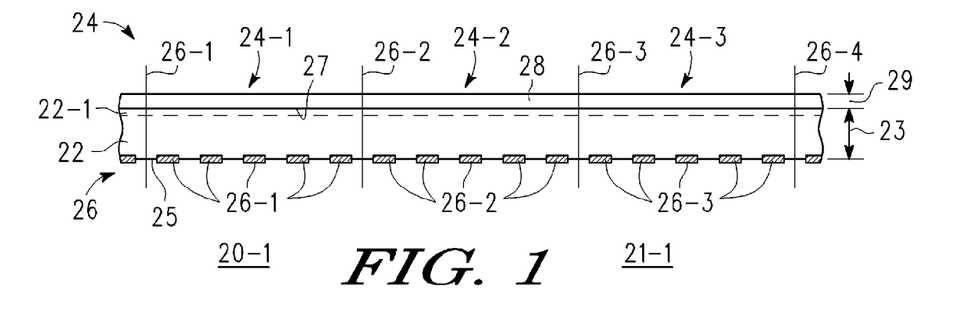
FIGS. 1 through 13 are simplified schematic cross-sectional views through an electronic assembly at different stages of manufacture, according to an embodiment of the present invention.

Wafer 22 is comprised of multiple semiconductor devices or integrated circuits 24-1, 24-2, 24-3, etc., (collectively "die" 24) that may be singulated, that is separated into individual die 24, as indicated by scribe or saw cut lines 26-1, 26-2, 26-3, 26-4, etc., (collectively cut lines 26). Die 24 have first faces 25 on which are located electrical connections 26-1, 26-2, 26-3, etc., (collectively 26). As used herein, the word "die" is intended to be either singular or plural. In some embodiments, second or rear surface 27 of wafer 22 and die 24 has thereon a highly conductive coating, as for example, gold, or other conductive region 22-1, often referred to as "back-side metal." Second or rear surface 27 is coated with sacrificial material 28 of thickness 29. Photoresist is an example of a suitable sacrificial material, but other materials can also be used. It is desirable in some embodiments that material 28: (i) can be applied with substantially uniform thickness, (ii) does not significantly chip or crack during die singulation, (iii) can withstand subsequent processing steps (e.g., application and curing of a plastic support material), and (v) can be removed at a later stage of the manufacturing process by a solvent or other means that does not adversely affect the partially completed assembly or already installed elements. Sacrificial material 28 is conveniently applied as a spin-on coating but other techniques for applying a photoresist or equivalent material having the properties listed above may also be used. Thickness 29 is usefully in the range of about 5 to 50 micrometers, more conveniently about 20 to 40 micrometers and preferably about 30 micrometers. Structure 21-1 results.

Figure 2:
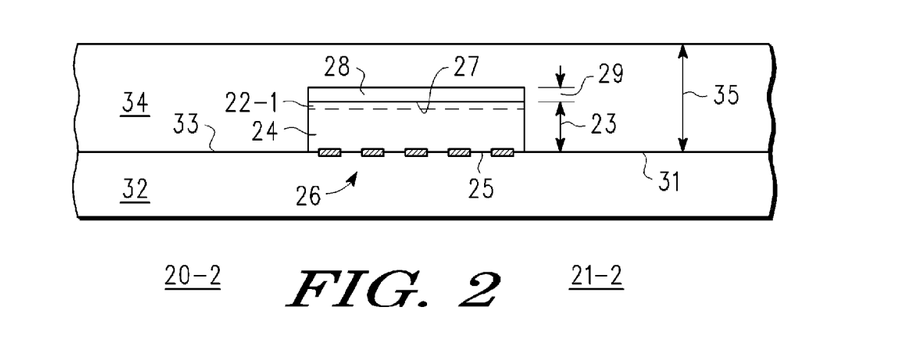
Figure 3:
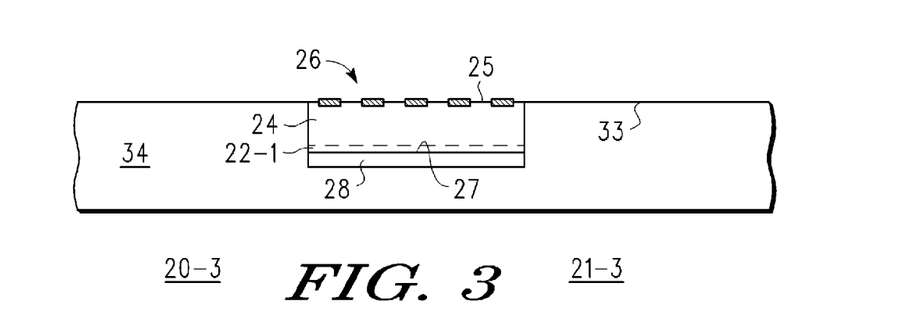

Referring now to manufacturing stage 20-2 of FIG. 2, wafer 22 is singulated, that is, separated into individual die 24. For convenience of explanation, FIGS. 2 though 13 illustrate how a single die 24 is used in forming electronic assembly 30 of FIGS. 13-14, but persons of skill in the art will understand based on the explanation herein that multiple die 24 and other components may be included in electronic assembly 30, depending upon the desired properties of electronic assembly 30. It is desirable in the finished electronic assembly, that die 24 be able to be directly coupled to an external motherboard heat sink and/or ground plane. In manufacturing stage 20-2, die 24 is mounted by first face 25 on surface 31 of temporary substrate 32. A non-limiting example of a suitable material for substrate 32 is a material commonly used in the art referred to as, "framing tape." Framing tape is a comparatively thin plastic sheet having a sticky surface. It is usually stretched across a support hoop so that it is flat and in tension. First face 25 of die 24 is conveniently pressed onto the sticky surface of the framing tape. Other attachment means may also be used provided that at a later stage of manufacture, die 24 (and surface 33 of first support material 34) and surface 31 of temporary substrate 32 may be separated without damage to die 24 and contacts 26. The combination of die 24 and surface 31 of temporary substrate 32 is then over-molded with first support material 34 of thickness 35. Surface 33 of first support material 34 rests against surface 31 of temporary substrate 32. Thermosetting or epoxy resin and other mold compounds such as are typically used for plastic encapsulation of electronic components and integrated circuits (ICs) are examples of material suitable for first support material 34. However, other materials can also be used provided that they do not interact adversely with the various elements of assembly 30, for example, not cause significant corrosion or moisture absorption or require excessive cure temperatures, etc. Thickness 35 is desirably about 3 to 10 times the sum of thickness 23 of die 24 and thickness 29 of material 28, more conveniently about 3 to 7 times and preferably about 3 to 5 times such thickness. Stated another way, thickness 35 is desirably in the range of about 0.3 to 1 millimeters, but larger or smaller values may also be used depending upon how robust the combination needs to be for subsequent processing and the thickness of die 24. Material 28 is covered by first support material 34. Structure 21-2 results. In manufacturing stage 20-3 of FIG. 3, temporary substrate 32 is removed, e.g., die 24 with over-molded first support material 34 is separated from the sticky surface of the framing tape. In the illustration of FIG. 3, the combination of first support material 34 and die 24 has been flipped up side down compared to FIG. 2. Structure 21-3 results.

Figure 4:
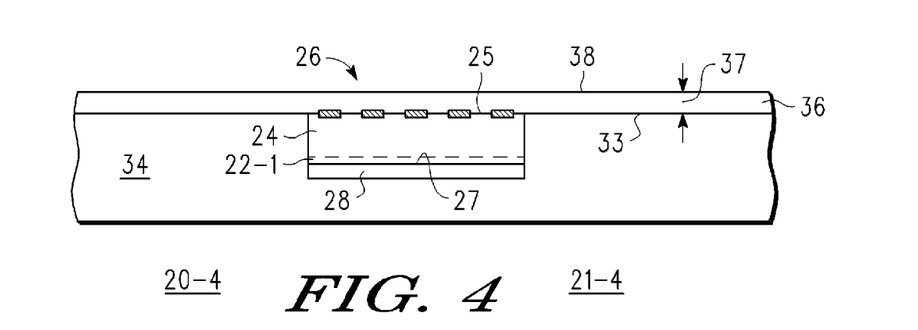
Figure 5:
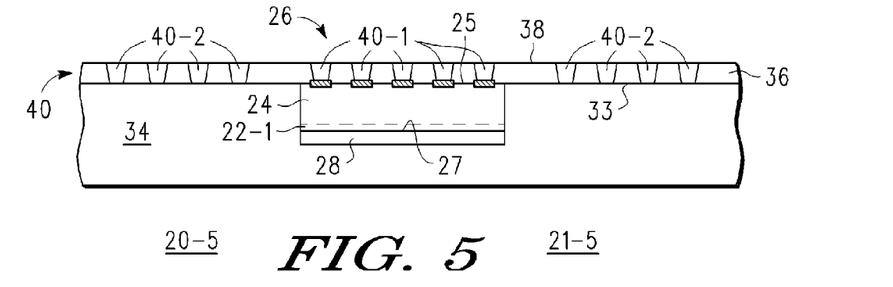

Referring now to manufacturing stage 20-4 of FIG. 4, surface 33 of first support material 34 and first face 25 of die 24 are covered by dielectric layer 36 of thickness 37, having upper or outer surface 38. A spin-on passivation material is suitable for dielectric layer 36. Thickness 37 is desirably in the range of about 10 to 30 micrometers, more conveniently about 15 to 25 micrometers, and preferably about 20 micrometers. Other insulating materials and processing techniques may be used provided that they provide relatively low leakage insulators with comparatively low dielectric constant and are compatible with subsequent manufacturing steps. Oxides, fluorides and organic films are non-limiting examples of other suitable materials. Structure 21-4 results. In manufacturing stage 20-5 of FIG. 5, structure 21-4 of FIG. 4 is etched to provide vias 40, wherein some vias 40-1 are aligned so as to expose contacts 26 on surface 25 of die 24 and other vias 40-2 extend through dielectric layer 36 to surface 33 of first support material 34 laterally outside die 24. Structure 21-5 results. In manufacturing stage 20-6 of FIG. 6, vias 40 are filled with electrical conductors 42 of for example, highly conductive metals or semi-metals. Cu, W, Ti, Au, TiW and various alloys and mixtures thereof are non-limiting examples of suitable conductors, but others can also be used. Plated copper is preferred. Electrical conductors 42-1 located in vias 40-1 make contact with contacts 26 on die 24, while other conductors 42-2 in vias 40-2 merely extend to surface 33 of first support material 34.

Figure 6:
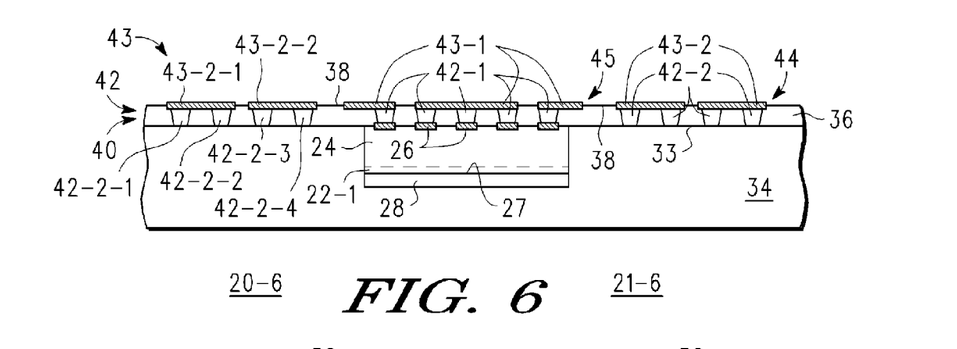

In a further portion of manufacturing stage 20-6, localized conductors 43, (e.g., 43-1, 43-2, etc.) are formed so as to make electric contact to and between various of electrical conductors 42 (e.g., 42-1, 42-2, etc.) in vias 40. This is conveniently accomplished by a masking step during which a conductor layer (e.g., also copper) is locally etched to define the desired localized conductors. Localized conductors 43 may contact one or more of electrical conductors 42 in vias 40 as well s providing interconnections to other vias or die attachment locations and also, if desired, provide components such as inductors, RF splitters, etc. For example and not intended to be limiting, the example of FIG. 6 shows localized conductors 43-2-1 bridging electrical conductor 42-2-1 and 42-2-2 in adjacent vias and localized conductor 43-2-2 bridging electrical conductors 42-2-3 and 42-2-4 in others vias. The combination of dielectric layer 36, vias 40, electrical conductors 42 and localized conductors 43 provides first interconnect layer 44 having upper surface 45 on which localized conductors 43 are exposed. First interconnect layer 44 can be used to electrically couple various elements of integrated electronic assembly 30. Localized conductors 43 may be formed from the plated material used to fill vias 40, by for example, plating not only the vias but a surface layer as well which is then masked and etched. Alternatively, after planarizing the via filling conductors, a substantially uniform further conductor can be deposited or otherwise formed on surface 38 and then masked and etched to define the desired localized conductors. Either arrangement is useful. Structure 21-6 results.

Figure 7:
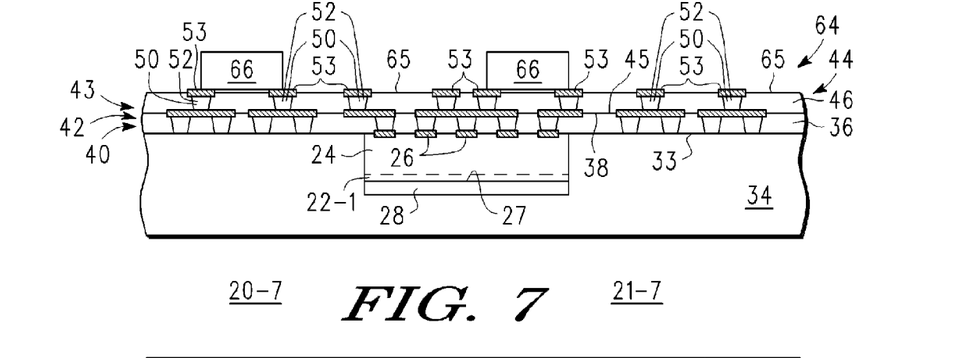

In manufacturing stage 20-7 of FIG. 7, dielectric layer 46 is deposited on surface 45 of first interconnect layer 44. Vias 50 analogous to vias 40 of FIG. 6 are etched through dielectric layer 46 and filled with electrical conductor 52 and localized conductors 53 deposited or otherwise provided thereon, so that the combination of electrical conductors 52 and localized conductors 53 makes connection to localized conductors 43 of first interconnect layer 44. The combination of dielectric layer 46, vias 50, electric conductors 52 and localized conductors 53 forms second interconnect layer 64 having outer surface 65. The same materials and fabrication techniques described in connection with first interconnect layer 44 can be used for second interconnect layer 64. Once second interconnect layer 64 has been formed, then in this example, electronic die or chips 66 are electrically coupled to localized connections 53 as needed by the design of electronic assembly 30 (see FIGS. 13-14). Persons of skill in the art will understand that electronic die or chips 66 may be of any type and may be mounted on interconnect layer 64 by any convenient means (e.g., wire bonding, flip-chip bonding, beam lead bonding, solder bump bonding, and other techniques). Structure 21-7 results. It will also be appreciated that although only two interconnect layers are illustrated, that any number of interconnect layers from one layer to many layers can be provided using the above described techniques.

Figure 8:
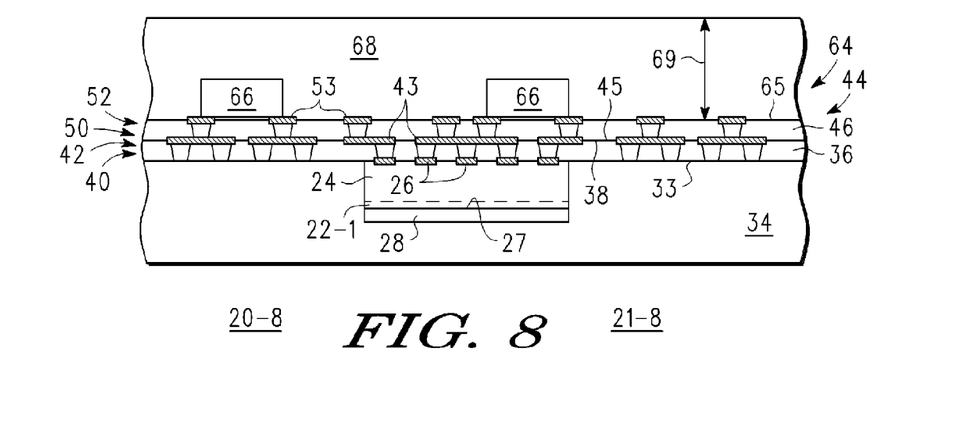

In manufacturing stage 20-8 of FIG. 8, surface 65 and die 66 of structure 21-7 are over-molded with further support material 68 of thickness 69. Thermoset and/or epoxy resins and other mold compound materials described in connection with first support material 34 are example of a suitable material for further support material 68 and the discussion concerning first support material 34 is incorporated herein by reference. Thickness 69 is desirably in the range of about 0.25 to 5 millimeters, conveniently about 0.25 to 3 millimeters and preferably about 0.25 to 0.75 millimeters.

Figure 9:
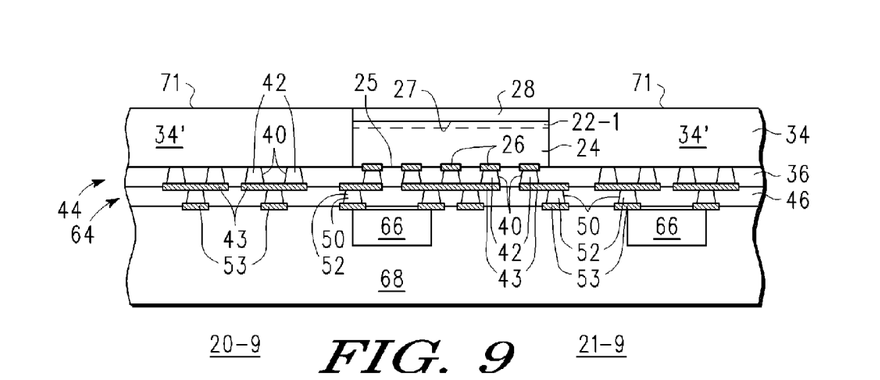

Referring now to manufacturing stage 20-9 of FIG. 9, in which structure 21-8 of FIG. 8 has been once again flipped upside down. Second surface 27 of die 24 now faces up in FIG. 9. First support material 34 has been lapped back to provide residual first support material 34' with upper surface 71. Sacrificial layer 28 continues to protect rear second face 27 of die 24. This is to insure that there is no damage to back-side conductor 22-1. Structure 21-9 results. In manufacturing stage 20-10 of FIG. 10, sacrificial layer 28 is removed, leaving residual step 28' between second (rear or backside) surface 27 of die 24 and surface 71 of remaining portions 34' of first support material 34. Residual step 28' is typically 3 to 10 micrometers high, that is, surface 27 is typically recessed by that amount from surface 71. Structure 21-10 results. In manufacturing stage 20-11 of FIG. 11, vias 70 are etched through remaining portion 34' of first support material 34 laterally outside die 24 so as to lie above selected electrical conductors 42 in vias 40 of first interconnect layer 44. Structure 21-11 results. In manufacturing stage 20-12 of FIG. 12, vias 70 are filled with conductor (e.g., copper) 72 and at the same time, step 28' above surface 27 of die 24 is also filled with conductor 72' (e.g., copper). To insure that the upper surface of conductors 72 in vias 70 and surface 71 of residual first support material 34' and conductor 72' above die 24 are substantially coplanar, it is desirable to perform a chemical-mechanical polish after the metal (e.g., copper) is plated into vias 70 and onto surfaces 27 and 71. Structure 21-12 results. In manufacturing stage 20-13 of FIG. 13, localized conductors 73 (e.g., 73-1, 73-2) are provided. This can be accomplished by continuing the metal plating used to fill vias 70 and residual step 28' to provide a substantially uniform layer over surface, and then doing a mask and etch to provide further localized conductors 73. Alternatively, a uniform conductor layer can be formed over structure 21-13 and then masked and etched to provide further localized conductors 73. Either technique is useful. In either case, the result is illustrated in structure 21-13 of FIG. 13, in which further localized conductors provide low thermal and electrical impedance contacts to second (backside) die surface 27 and conductors 42, 43 of interconnect layer 44 and through conductors 42, 43 of interconnect layer 44 to conductors 62 and 63 of interconnect layer 64. Structure 21-13 results. Electronic assembly 30 is now substantially complete.

Figure 10:
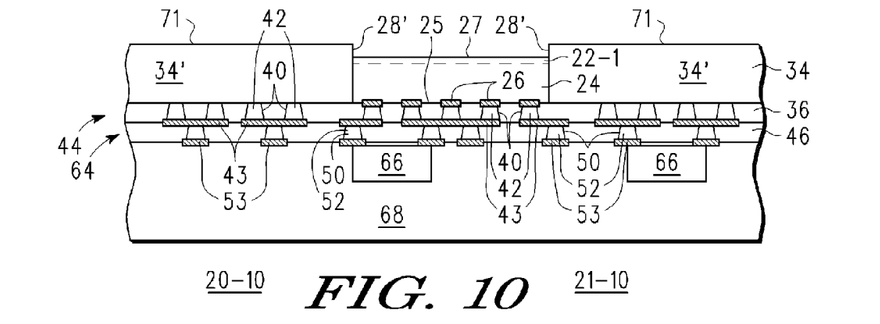
Figure 11:
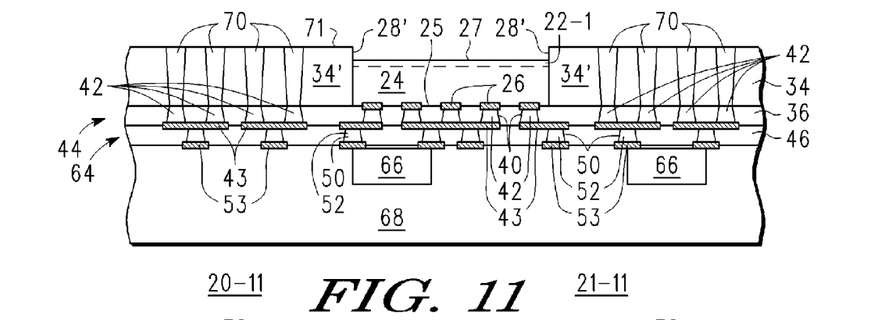
Figure 12:
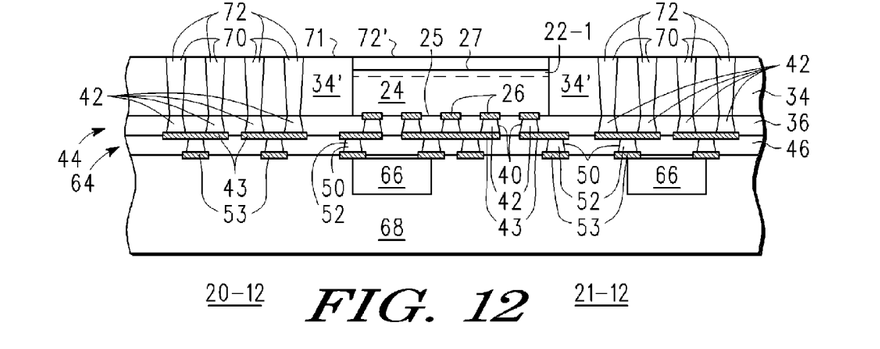
Figure 13:
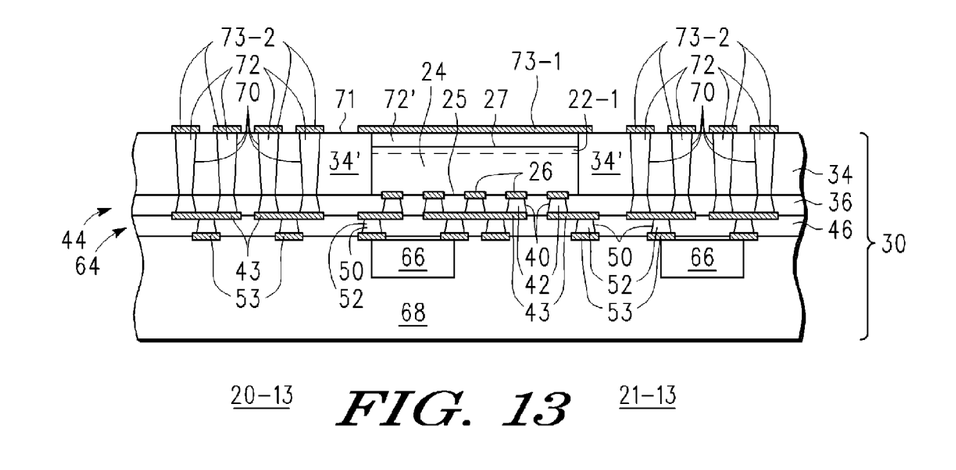
Figure 14:
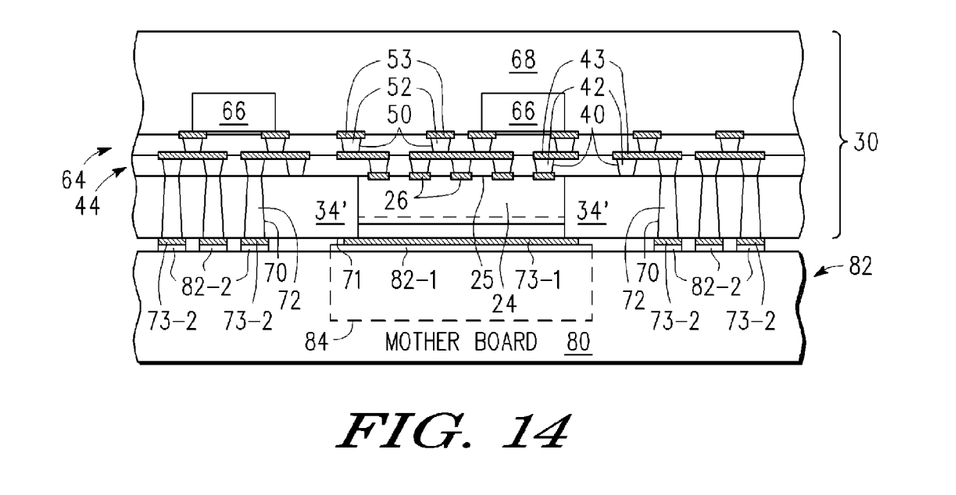
FIG. 14 is a simplified schematic cross-sectional view through the electronic assembly of FIG. 13 illustrating how it may be attached to a mother board without need for intermediate heat sinks.

FIG. 14 is a simplified schematic cross-sectional view through electronic assembly 30 of FIG. 13 illustrating how it may be attached to motherboard 80 without need for intermediate heat sinks or wirebonds (although such additions are not precluded). In FIG. 14, electronic assembly 30 of FIG. 13 is shown mated to electrical and thermal motherboard 80. Structure 21-13 and electronic assembly 30 of FIG. 10 is flipped upside down in FIG. 14 compared to FIG. 13. Electrical connections 82-2 of motherboard 80 make electrical connection to further localized conductors 73-2 of assembly 30 for inputs, outputs, power, ground, etc., and connection 82-1 makes thermal contact (and electrical if desired) with localized conductor 72-1 on second (rear) face 27 of die 24, which in many cases serves as an electrical ground contact as well as a heat transfer surface. It will be noted that, as a consequence of structure 21-13 produced by the manufacturing stages 20-1 through 20-13, there is no need to provide a heat transfer slug between die 24 and motherboard 80. Thus, the thermal dissipation path (and electrical ground path) between die 24 and motherboard 80 is minimized. Further, the manufacturing arrangement illustrated in stages 20-1 through 20-13 allows all of the external connections to and from assembly 30 to be brought out via conductors 72 in vias 70 and further conductors 73 to single surface 71 where they can be easily coupled to mating contacts 82 on motherboard 80. This is of great convenience in producing a finished electronic product incorporating electronic assembly 30, since intermediate wirebonds and the like can be minimized or avoided. An additional advantage of the structure and method described above is that it can result in very low inductance connections, as for example, a ground connection provided by conductors 72' and 73-1 on rear face 27 of die 24. This is very important in obtaining high circuit performance at very high frequencies. A still further advantage of the structure and method described above is that assembly 30 can be three dimensional in the sense that die 66, for example, can be mounted above die 24, rather than having to be mounted on the same plane or if on different planes, mounted without overlap. This is a great advantage because it permits assemblies manufactured according to the above-described process to be more compact laterally as well as vertically. Thus, the overall size of assembly 30 can be substantially reduced compared to prior art assemblies performing the same functions, and therefore, the final product to be also reduced in size. Accordingly, the above described manufacturing process and structure is an important improvement over the prior art A metallic heat sink illustrated generally by outline 84 may be included in motherboard 80 to further facilitate heat removal from second (rear) face 27 of die 24. In some cases, rather than a monolithic heat sink embedded within motherboard 80, a number of metal filled vias in motherboard 80 are placed in contact with further conductor 73-1 and extend through motherboard 80 to conduct heat away to an external heatsinik (not shown) coupled to the lower face of motherboard 80. Thus, the manufacturing process illustrated herein provides an electronic assembly in which the thermal distance between the source heat (e.g., near surface 25 of die 24) and external heat dissipating surface 27 of assembly 30, is substantially limited to thickness 23 of die 24. This is a significant advantage and provides improved performance.

The thermal resistance $\Theta jc$ in degrees Celsius per Watt is a figure of merit useful in evaluating the thermal performance of various die packaging designs. It is generally measured from the device junction location to the outer surface of the finished assembly from which heat can be extracted. In the case of assembly 30, the measurement is made approximately from first (front) die surface 25 (which is near the location of the heat dissipating junctions of die 24) to rear surface electrode 73-1 which interfaces with motherboard 80 and from which heat can be extracted. For the case of assembly 30 with die 24 being a 75 micrometer thick silicon die, Θjc was found to be about 11.8 degrees Celsius per Watt. Prior art assemblies with a laminate board using best commercial design practices and the same die gave Θjc of about 30 degrees Celsius per Watt. Thus, assembly 30 made by the above-described manufacturing process provided Θjc over 60% lower than otherwise similar prior art structures. This is a very significant improvement and can add greatly to the product reliability and performance since, other things being equal, die 24 can operate at lower junction temperature. This is highly desirable.

Figure 15:
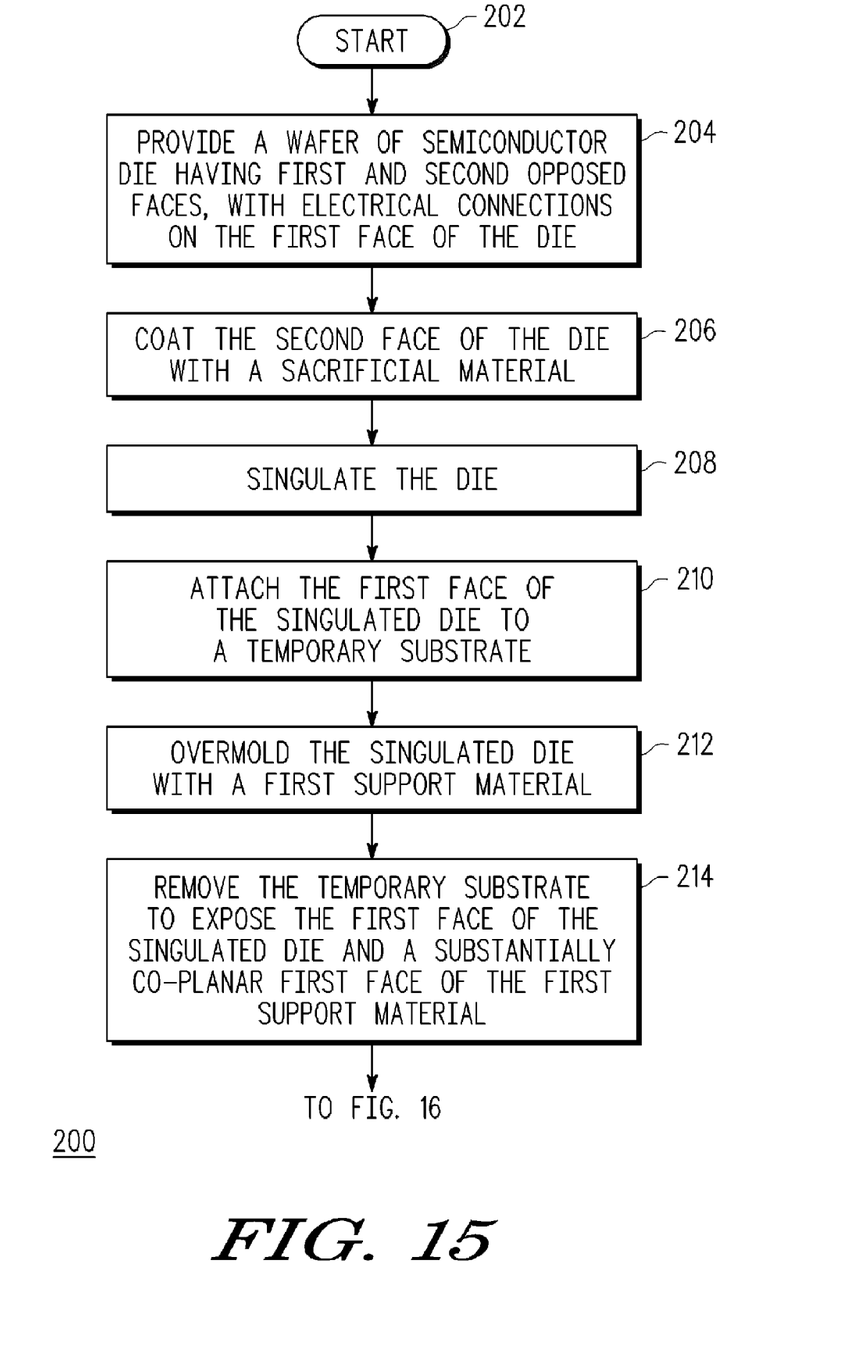
FIGS. 15 through 17 are simplified flow charts of a method of forming an electronic assembly, according to a further embodiment of the present invention.
Figure 16:
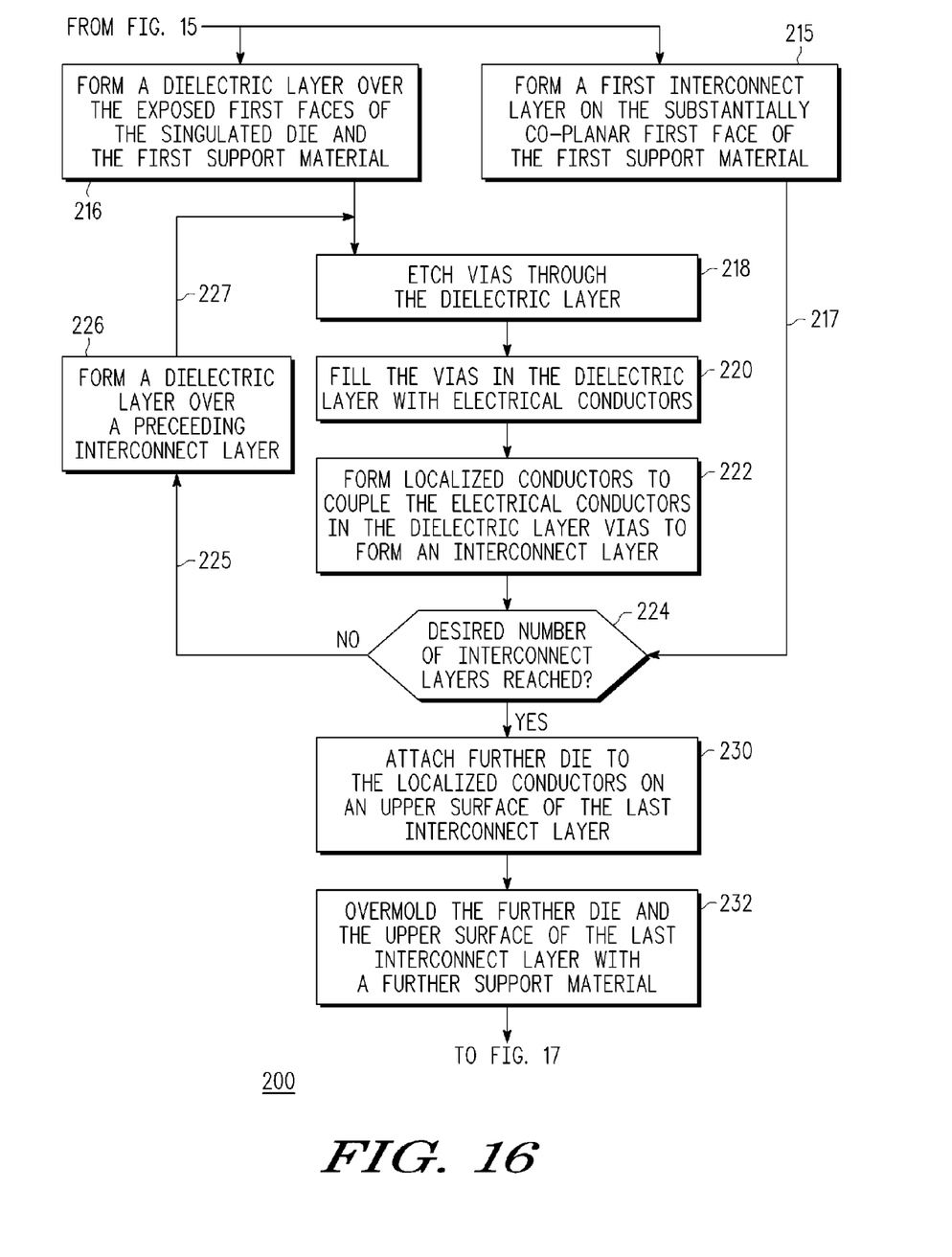
Figure 17:
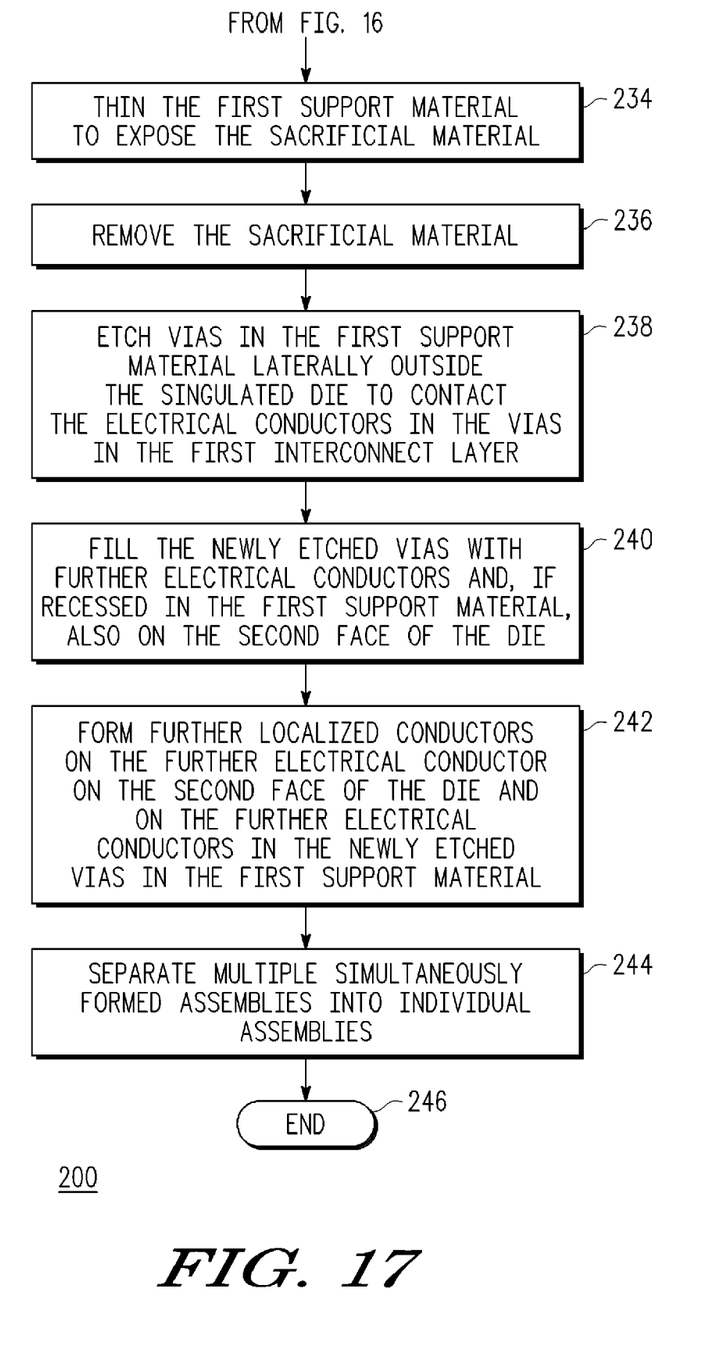

FIGS. 15 through 17 are simplified flow charts of method 200 of forming electronic assembly 30, according to a further embodiment of the present invention. Reference should also be had to FIGS. 1-13 wherein various individual steps and various regions and structures are described and identified. Referring now to FIG. 15, method 200 begins with START 202 and initial step 204 in which there is provided a wafer 22 of semiconductor die 24 having first face 25 and opposed second face 27 with electrical connections on first face 25. In step 206, second (rear) faces 27 of die 24 (preferably still in wafer form) are coated with a layer of sacrificial material 28, e.g., photoresist. In step 208, wafer 22 is singulated, that is, sawn or otherwise cut or broken up into individual die 24. It is important that sacrificial material 28 not significantly crack or chip during singulation. In subsequent step 210, first face 25 of die 24 having electrical contacts 26 thereon is attached to temporary substrate 32, e.g., a tensioned sticky "framing tape," from which it can subsequently be released. In step 212, second (rear) face 27 of die 24 and temporary support 32 are over-molded with first support material 34. Semiconductor plastic encapsulation materials are examples of materials useful for first support material 34. In step 214, the temporary substrate (e.g., the sticky tape) is separated from first face 25 of die 24 (and die electrical contacts 26) and from first face 33 of first support material 34.

Referring now to FIG. 16, two embodiments are illustrated: (a) a first embodiment wherein method 200 proceeds to step 215 wherein a first conductive interconnect layer of a highly conductive metal (e.g., copper) is formed (e.g., by deposition and masking) on first face 33 of first support material 34 and coupled to some or all of electrical contacts 26 on first face 25 of die 24, and then subsequent interconnect layer(s), if desired, are formed by proceeding to step 224 as shown by path 217 and then step 226 as shown by path 225 and then steps 218-222 as shown by path 227, or (b) a second embodiment, wherein method 200 omits step 215 and proceeds directly to step 216 wherein dielectric layer 36 is formed on first face 25 (and contacts 26) of die 24 and on first face 33 of first support material 34. As noted earlier, dielectric layer 36 may be formed from any insulating material, but a spin-on dielectric is preferred. In subsequent step 218, vias 40 are etched through dielectric layer 36. In step 220, vias 40 in dielectric layer 36 are filled with conductors 42 of a highly conductive metal, e.g., copper. Plating is a preferred technique for filling vias 40. Method 200 then proceeds to step 222 wherein localized conductors are formed to couple electrical conductors 42 in vias 40 to form an interconnect layer, e.g., interconnect layer 44. As noted earlier, the localized conductors formed in step 222 may be derived, e.g., by masking and etching, directly from the plated material after the vias have been filled or from another conductor layer formed separately from the vias. Either method is useful. If method 200 proceeds via step 215, then interconnect layer 44 is the second interconnect layer. If method 200 proceeds directly to step 216 by passing step 215, then interconnect layer 44 is the first interconnect layer. Method 200 proceeds to query 224 wherein it is determined whether or not the desired number of interconnect layers have been reached. If the outcome of query 222 is "NO" then method 200 proceeds to step 226 wherein another dielectric layer is formed over a preceding interconnect layer, and then steps 218, 220, 222 and 224 are repeated. When the outcome of query 224 is "YES", then method 200 desirably proceeds to step 230 wherein, according to the needs of assembly 30, further die (e.g., 66) are attached to localized conductors (e.g., 53) on an upper surface (e.g., 65) of the last interconnect layer (e.g., interconnect layer 64). If only one interconnect layer is needed for assembly 30, then step 230 may be performed immediately after step 215 or step 222, depending upon which embodiment of the method is used. In step 232, the further die (e.g., 66) and the upper surface (e.g., 65) of the last interconnect layer (e.g., 64) is over-molded with a further support material (e.g., 68).

Referring now to FIG. 17, step 234 is performed wherein first support material 34 is reduced in thickness to expose sacrificial material 28. Subsequent steps 236 and 238 may be performed in either order. In step 236, sacrificial material 28 is removed, once again exposing second (rear) face 27 of die 24. In step 238, vias 70 are formed in first support material 34 laterally outside side die 24, extending to contact electrical conductors in the first interconnect layer, i.e., the interconnect layer resulting from step 215 or 222 without 215. Where step 215 has been omitted then vias 70 extend to conductors 42 in vias 40. It is not necessary that all conductors of the first interconnect layer be contacted by such vias, only those to or from which external signals are to be introduced or extracted. In step 240, newly etched vias 70 are filled (e.g., by plating) with electrically conductive material 72, e.g., a highly conductive metal of which copper is a non-limiting example. If second (rear) face 27 of die 24 is recessed in first support material 34', that is, below the level of surface 71 of support material 34' by amount 28' (e.g., see FIGS. 10-11), then conductive material 72' (see FIG. 12) is formed on second (rear) face 27 at the same time that vias 70 are being filled, so that second (rear) face 27 is no longer recessed. It is desirable but not essential to planarized the plated conductor to provide a smooth level surface for optional step 242 which may be included in a further embodiment. In step 242, localized conductors 73 are desirably but not essentially provided making contact to electrical conductors 72 in vias 70 and to conductor 72' on second (rear) face 27 of die 24. As noted earlier, localized conductors 73 formed in step 242 may be derived, e.g., by masking and etching, directly from the plated material after vias 72 have been filled up or from another conductor layer formed separately from the vias. Either method is useful. Where multiple assemblies are being formed simultaneously, then method 200 proceeds to optional step 244 wherein the multiple assemblies are separated, e.g., by sawing, into individual assemblies 30. Assembly 30 is now substantially finished and method 200 proceeds to END 246.

According to a first embodiment, there is provided a method for manufacturing an electronic assembly, comprising, attaching an electronic die by its front surface to a temporary substrate, wherein the die has a sacrificial layer on its back surface and electrical contacts on its front surface, over-molding the sacrificial layer with a first material extending laterally over the temporary substrate, detaching the die and the first material from the temporary substrate, providing an interconnect layer over the first material and the die, having leads electrically coupled to the die contacts, over-molding the interconnect layer with a second material, thinning the first material to expose the sacrificial layer, removing the sacrificial layer, and providing conductors contacting the back surface of the die and the leads of the interconnect layer. According to a further embodiment, the method further comprises, planarizing the conductors on the rear face of the die and contacting the leads of the interconnect layer. According to a still further embodiment, the step of providing the conductors, further comprises, etching vias through portions of the first material laterally outside the die, extending to some leads in the interconnect layer, filling the vias with a conductor in electrical contact with the some leads in the first interconnect layer, and depositing a further conductor on the back surface of the die. According to a yet further embodiment, the filling and depositing steps further comprise, plating the conductor in the vias and the further conductor on the back surface of the die. According to a still yet further embodiment, the method further comprises after the plating step, planarizing the plated conductor. According to a yet still further embodiment, the plated conductor comprises copper. According to another embodiment, the method further comprises between the steps of providing an interconnect layer and over-molding the interconnect layer, attaching another electronic die to the interconnect layer. According to still another embodiment, the steps of providing an interconnect layer and over-molding the interconnect layer, further comprise, providing a first interconnect layer on the die and first material, having leads electrically coupled to the die contracts, and extending to an outer surface of the first interconnect layer, providing another interconnect layer on the first interconnect layer, having further leads electrically coupled to leads of the first interconnect layer, and having a further outer surface and outer conductors on the further outer surface coupled to the further leads, and over-molding the further outer surface and outer conductors with a second material. According to a yet another embodiment, the method further comprises prior to the over-molding step, attaching another die to the outer conductors on the further outer surface. According to a yet still another embodiment, the step of providing another interconnect layer further comprises, depositing a dielectric layer over the first interconnect layer, etching vias in the dielectric layer extending to leads of the first interconnect layer, plating conductors in the vias in the dielectric layer, the plated conductors contacting leads of the first interconnect layer and extending to the further outer surface, and applying interconnect conductors to the further outer surface coupling various conductors in the vias. According to a still yet another embodiment, the plated conductors comprise copper. According to an additional embodiment, the method further comprises, attaching the conductor contacting the back surface of the die to a heat sink.

According to a second embodiment, there is provided an electronic assembly manufactured by the method comprising, attaching an electronic die by its front surface to a temporary substrate, wherein the die has a sacrificial layer on its back surface and electrical contacts on its front surface, over-molding the sacrificial layer with a first material extending laterally over the temporary substrate, detaching the die and the first material from the temporary substrate, providing an interconnect layer over the first material and the die, having leads electrically coupled to the electrical contacts of the die, over-molding the interconnect layer with a second material, thinning the first material to expose the sacrificial layer, removing the sacrificial layer, and providing conductors contacting the back surface of the die and the leads of the interconnect layer. According to a further embodiment, the method of manufacturing the assembly further comprises, planarizing the conductors on the back surface of the die and contacting the leads of the interconnect layer. According to a still further embodiment, the method of manufacturing the assembly further comprises, attaching the conductor on the back surface of the die to a heat sink. According to a yet further embodiment, the steps of providing an interconnect layer and over-molding the interconnect layer, comprise, providing a first interconnect layer on the die and the first material, having leads electrically coupled to the electrical contracts of the die and extending to an outer surface of the first interconnect layer, providing another interconnect layer on the first interconnect layer having further leads electrically coupled to leads of the first interconnect layer and having a further outer surface and outer conductors on the further outer surface coupled to the further leads, and over-molding the further outer surface and outer conductors with a second material. According to a still yet further embodiment, the method of manufacturing the assembly further comprises prior to the over-molding step, attaching another die to the outer conductors on the further outer surface.

According to a third embodiment, there is provided a method for forming an electrical assembly, comprising, providing an electronic die with electrical contacts on a front face and a sacrificial material on an opposed rear face, attaching the front face to a temporary substrate, coating the sacrificial material and the temporary substrate laterally outside the die with a first support material, removing the temporary substrate thereby exposing the front face of the die and a first face of the first support material, forming one or more interconnect layers over the front face of the die and the first face of the first support material, having leads electrically coupled to the electrical contacts on the front face of the die, wherein an outermost interconnect layer has an outer surface with outer contacts thereon, over-molding the outer surface and outer contacts of the outermost interconnect layer with a second support material, removing a portion of the first support material to expose the sacrificial layer and a second surface of the first support material laterally outside the electronic die, removing the sacrificial layer to expose the rear face of the die, etching vias in the second surface of the first support material laterally outside the electronic die, extending through the first support material to leads of the first interconnect layer, and filling the vias and coating the rear face of the die with a further conductor, wherein the further conductor provides electrical coupling to leads of a first interconnect layer and electrical and thermal contact with the rear face of the die. According to a further embodiment, the method further comprises, coupling the conductor providing thermal contact with the rear face of the die to a heat sink. According to a still further embodiment, the method further comprises, prior to the step of over-molding the outer surface and outer contacts of the outermost interconnect layer with a second support material, attaching another electronic die to contracts of an outermost interconnect layer.

While at least one exemplary embodiment has been presented in the foregoing detailed description, it should be appreciated that a vast number of variations exist, especially with respect to choices of temporary support 32, first support material 34, dielectric layers 36, 46 contacts, conductors and interconnections 42, 43, 52, 53, 44, 46, second support material 68 and die 24 and 66, and individual methods for forming these various layers, regions and materials. It should also be appreciated that the exemplary embodiment are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for manufacturing an electronic assembly, comprising:
   attaching an electronic die by its front surface to a temporary substrate, wherein the die has a sacrificial layer on its back surface and electrical contacts on its front surface;
   over-molding the sacrificial layer with a first material extending laterally over the temporary substrate;
   detaching the die and the first material from the temporary substrate;
   providing an interconnect layer over the first material and the die, having leads electrically coupled to the die contacts;
   over-molding the interconnect layer with a second material;
   thinning the first material to expose the sacrificial layer;
   removing the sacrificial layer; and
   providing conductors contacting the back surface of the die and the leads of the interconnect layer.

2. The method of claim 1, further comprising, planarizing the conductors on the back surface of the die and contacting the leads of the interconnect layer.

3. The method of claim 1, wherein the step of providing the conductors, comprises:
   etching vias through portions of the first material laterally outside the die, extending to some leads in the interconnect layer;
   filling the vias with a conductor in electrical contact with the some leads in the first interconnect layer; and
   depositing a further conductor on the back surface of the die.

4. The method of claim 1, further comprising between the steps of providing an interconnect layer and over-molding the interconnect layer, attaching another electronic die to the interconnect layer.

5. The method of claim 1, wherein the steps of providing an interconnect layer and over-molding the interconnect layer, comprise;
   providing a first interconnect layer on the die and first material, having leads electrically coupled to the die contracts, and extending to an outer surface of the first interconnect layer;
   providing another interconnect layer on the first interconnect layer, having further leads electrically coupled to leads of the first interconnect layer, and having a further outer surface and outer conductors on the further outer surface coupled to the further leads; and
   over-molding the further outer surface and outer conductors with a second material.

6. The method of claim 1, further comprising, attaching the conductor contacting the back surface of the die to a heat sink.

7. The method of claim 3, wherein the filling and depositing steps comprise, plating the conductor in the vias and the further conductor on the back surface of the die.

8. The method of claim 7, further comprising after the plating step, planarizing the plated conductor.

9. The method of claim 7, wherein the plated conductor comprises copper.

10. The method of claim 5, further comprising prior to the over-molding step, attaching another die to the outer conductors on the further outer surface.

11. The method of claim 5, wherein the step of providing another interconnect layer on the first interconnect layer comprises:
    depositing a dielectric layer over the first interconnect layer;
    etching vias in the dielectric layer extending to leads of the first interconnect layer;
    plating conductors in the vias in the dielectric layer, the plated conductors contacting leads of the first interconnect layer and extending to the further outer surface; and
    applying interconnect conductors to the further outer surface coupling various conductors in the vias.

12. The method of claim 11, wherein the plated conductors comprise copper.

13. An electronic assembly manufactured by the method comprising:
    attaching an electronic die by a front surface of the die to a temporary substrate, wherein the die has a highly conductive coating and a sacrificial layer on a back surface of the die and electrical contacts on the front surface of the die;
    over-molding the sacrificial layer with a first material extending laterally over the temporary substrate;
    detaching the die and the first material from the temporary substrate;
    providing an interconnect layer over the first material and the die, having leads electrically coupled to the electrical contacts of the die;
    over-molding the interconnect layer with a second material;
    thinning the first material to expose the sacrificial layer but not to entirely remove the sacrificial layer, thus defining a surface of the first material that is planar with a surface of the sacrificial layer;
    removing the sacrificial layer so that the back surface of the die is recessed with respect to a surface of the first material, thus defining a recessed area at the back surface of the die; and
    providing conductors contacting the highly conductive coating on the back surface of the die and the leads of the interconnect layer, resulting in a conductor on the back surface of the die in the recessed area.

14. The assembly of claim 13, further comprising, planarizing the conductors on the back surface of the die and contacting the leads of the interconnect layer.

15. The assembly of claim 13, wherein the steps of providing an interconnect layer and over-molding the interconnect layer, comprise:
    providing a first interconnect layer on the die and the first material, having leads electrically coupled to the electrical contracts of the die and extending to an outer surface of the first interconnect layer;
    providing another interconnect layer on the first interconnect layer having further leads electrically coupled to leads of the first interconnect layer and having a further outer surface and outer conductors on the further outer surface coupled to the further leads; and
    over-molding the further outer surface and outer conductors with a second material.

16. The assembly of claim 14, further comprising, attaching the conductor on the back surface of the die to a heat sink.

17. The assembly of claim 15, further comprising prior to the over-molding step, attaching another die to the outer conductors on the further outer surface.

18. A method for forming an electrical assembly, comprising:
- providing an electronic die with electrical contacts on a front face and a sacrificial material on an opposed rear face;
- attaching the front face to a temporary substrate;
- coating the sacrificial material and the temporary substrate laterally outside the die with a first support material;
- removing the temporary substrate thereby exposing the front face of the die and a first face of the first support material;
- forming one or more interconnect layers over the front face of the die and the first face of the first support material, having leads electrically coupled to the electrical contacts on the front face of the die, wherein an outermost interconnect layer has an outer surface with outer contacts thereon;
- over-molding the outer surface and outer contacts of the outermost interconnect layer with a second support material;
- removing a portion of the first support material to expose the sacrificial layer and a second surface of the first support material laterally outside the electronic die;
- removing the sacrificial layer to expose the rear face of the die;
- etching vias in the second surface of the first support material laterally outside the electronic die, extending through the first support material to leads of the first interconnect layer; and
- filling the vias and coating the rear face of the die with a further conductor, wherein the further conductor provides electrical coupling to leads of a first interconnect layer and electrical and thermal contact with the rear face of the die.

19. The method of claim 18, further comprising, coupling the conductor providing thermal contact with the rear face of the die to a heat sink.

20. The method of claim 18, further comprising prior to the step of over-molding the outer surface and outer contacts of the outermost interconnect layer with a second support material, attaching another electronic die to contracts of an outermost interconnect layer.

* * * * *